United States Patent
Farooq et al.

(10) Patent No.: US 9,671,215 B2
(45) Date of Patent: Jun. 6, 2017

(54) WAFER TO WAFER ALIGNMENT

(71) Applicant: International Business Machines Corporation, Armonk, NY (US)

(72) Inventors: Mukta G. Farooq, Hopewell Junction, NY (US); John A. Fitzsimmons, Poughkeepsie, NY (US); Spyridon Skordas, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 236 days.

(21) Appl. No.: 14/576,072

(22) Filed: Dec. 18, 2014

(65) Prior Publication Data

US 2016/0178344 A1 Jun. 23, 2016

(51) Int. Cl.
*G01B 7/31* (2006.01)
*H01L 21/66* (2006.01)
*H01L 23/544* (2006.01)

(52) U.S. Cl.
CPC ............. *G01B 7/31* (2013.01); *H01L 22/34* (2013.01); *H01L 23/544* (2013.01); *H01L 2223/5442* (2013.01); *H01L 2223/5446* (2013.01); *H01L 2223/54426* (2013.01)

(58) Field of Classification Search
CPC .......................... H01L 22/34; H01L 23/544
See application file for complete search history.

(56) References Cited

U.S. PATENT DOCUMENTS 6,426,687 B1 7/2002 Osborn
6,686,254 B2 * 2/2004 Petrucci ............. H01L 21/3065
257/356

(Continued)

FOREIGN PATENT DOCUMENTS

KR 1020090126974 A 12/2009
KR 1020110135280 A 12/2011

OTHER PUBLICATIONS

"Multilayer silicon RF system-in-package technique using magnetically aligned anisotropic conductive adhesive" Sungwook Moon; Khanna, S.K.; Chappell, W.J. Microwave Symposium Digest, 2009. MTT '09. IEEE MTT-S International Publication Year: 2009, pp. 797-800 Digital Object Identifier: 10.1109/MWSYM.2009.5165817.

(Continued)

*Primary Examiner* — Errol Fernandes
(74) *Attorney, Agent, or Firm* — Law Offices of Ira D. Blecker, P.C.

(57) ABSTRACT

Wafer to wafer alignment which includes a first semiconductor wafer and a second semiconductor wafer. The first and second semiconductor wafers have selectively-activated alignment arrays for aligning the first semiconductor wafer with the second semiconductor wafer. Each of the alignment arrays include an alignment structure which includes an antenna connected to a semiconductor device. The antenna in each of the alignment arrays is selectively activated to act as a charge source or as a charge sensing receptor. The alignment arrays are located in the kerf areas of the semiconductor wafers. The semiconductor wafers are aligned when the charge sources on one semiconductor wafer match with the charge sensing receptors on the other semiconductor wafer.

20 Claims, 6 Drawing Sheets

(56) References Cited

U.S. PATENT DOCUMENTS

2012/0187530 A1* 7/2012 Zhang .................. H01L 23/645
257/531
2015/0069421 A1* 3/2015 Farooq .................... H01L 22/12
257/80

OTHER PUBLICATIONS

"Wafer-to-Wafer Alignment for Three-Dimensional Integration: A Review" Sang Hwui Lee; Kuan-Neng Chen; Lu, J.J.-Q. Microelectromechanical Systems, Journal of vol. 20, Issue: 4, Publication Year: 2011, pp. 885-898 Digital Object Identifier: 10.1109/JMEMS.2011.2148161.

* cited by examiner

WAFER TO WAFER ALIGNMENT

BACKGROUND

The present exemplary embodiments relate to the alignment of semiconductor wafers during the stacking of semiconductor wafers and, more particularly, relate to an apparatus and method for the accurate alignment of semiconductor wafers using triangulation.

The packaging density in the electronics industry continuously increases in order to accommodate more electronic devices into a package. In this regard, three-dimensional (3D) wafer-to-wafer stacking technology substantially contributes to the device integration process. Typically, a semiconductor wafer includes several layers of integrated circuitry (e.g., processors, programmable devices, memory devices, wiring, etc.) built on a semiconductor substrate. In order to form a 3D wafer stack, two or more wafer substrates are placed on top of one other and bonded.

3D wafer stacking technology offers a number of potential benefits, including, for example, improved form factors, lower costs, enhanced performance, and greater integration through system-on-chip (SOC) solutions. In addition, the 3D wafer stacking technology may provide other functionality to the chip. For instance, after being formed, the 3D wafer stack may be diced into stacked dies or chips, with each stacked chip having multiple tiers (i.e., layers) of integrated circuitry. SOC architectures formed by 3D wafer stacking can enable high bandwidth connectivity of products such as, for example, logic circuitry and dynamic random access memory (DRAM), that otherwise have incompatible process flows. At present, there are many applications for 3D wafer stacking technology, including high performance processing devices, video and graphics processors, high density and high bandwidth memory chips, and other SOC solutions.

Proper alignment of the semiconductor wafers before bonding is critical to the functionality of 3D interconnected structures. To enable high-density 3D structures, improved accuracy and cost-effective alignment processes are required.

Presently, wafer to wafer alignment for bonding is accomplished through complicated alignment techniques that rely on geometric transpositions of passive structures that represent geometric coordinates on one wafer such that a minimization of alignment error may be accommodated through an external measurement analysis and feedback instrumentation. Instrumentation relies on optical measurement and detection sensors that predominantly operate in the optical and infrared or near infrared range of the electromagnetic spectrum. Multiple sources of error are inherent in this range of the electromagnetic spectrum: such as refraction of image signal due to possible non-optical linearity of the substrate, opacity of substrate due to metal masking layers, intrinsic error in accuracy due to IR wavelength, relative calibration errors in the case of separate optical microscopes, etc.

BRIEF SUMMARY

The various advantages and purposes of the exemplary embodiments as described above and hereafter are achieved by providing, according to a first aspect of the exemplary embodiments, wafer to wafer alignment which includes:
a first semiconductor wafer having a plurality of semiconductor chips and kerf areas surrounding each of the semiconductor chips and a second semiconductor wafer having a plurality of semiconductor chips and kerf areas surrounding each of the semiconductor chips;
the first semiconductor wafer having a plurality of selectively-activated first alignment arrays for aligning the first semiconductor wafer with the second semiconductor wafer, each of the first alignment arrays comprising a difference engine and at least one alignment structure comprising at least one antenna connected to a semiconductor device on the first semiconductor wafer, the at least one antenna in each of the first alignment arrays being selectively activated to act as a charge source or as a charge sensing receptor, the first alignment arrays being located in the kerf areas of the first semiconductor wafer;
the second semiconductor wafer having a plurality of selectively activated second alignment arrays for aligning the first semiconductor wafer with the second semiconductor wafer, each of the second alignment arrays comprising a difference engine and at least one alignment structure comprising at least one antenna connected to a semiconductor device on the second semiconductor wafer, the at least one antenna in each of the second alignment arrays being selectively activated to act as a charge source or as a charge sensing receptor, the second alignment arrays being located in the kerf areas of the second semiconductor wafer; and
wherein in operation the antenna in the at least one alignment structure in each of the first alignment arrays being activated as the charge sensing receptor to form a plurality of charge sensing receptors and the antenna in the at least one alignment structure in the second alignment arrays being activated as the charge source to form a plurality of charge sources, the first semiconductor wafer and the second semiconductor wafer being moved relative to one another until the plurality of source charges sensed by the plurality of charge sensing receptors and processed by the difference engine in each of the first alignment arrays are substantially equal at each of the plurality of charge sensing receptors.

According to a second aspect of the exemplary embodiments, there is provided a semiconductor wafer having alignment structure which includes:
a plurality of semiconductor chips and kerf areas surrounding each of the semiconductor chips;
a plurality of selectively-activated alignment arrays for aligning the semiconductor wafer with another semiconductor wafer, each of the alignment arrays comprising a difference engine and at least one alignment structure comprising at least one antenna connected to a semiconductor device on the semiconductor wafer, the at least one antenna in each of the alignment arrays being selectively activated to act as a charge source or as a charge sensing receptor, the alignment arrays being located in the kerf areas of the first semiconductor wafer; and;
wherein in operation the antenna in the at least one alignment structure in each of the alignment arrays being selectively activated as the charge sensing receptor to form a plurality of charge sensing receptors or being selectively activated as the charge source to form a plurality of charge sources, the selectively activated plurality of charge sensing receptors or the selectively activated plurality of charge sources cooperating with the another semiconductor wafer to align the semiconductor wafer with the another semiconductor wafer.

According to a third aspect of the exemplary embodiments, there is provided a method of wafer to wafer alignment comprising:

(a) obtaining a first semiconductor wafer having a plurality of selectively-activated first alignment arrays for aligning the first semiconductor wafer with a second semiconductor wafer, each of the first alignment arrays comprising a difference engine and at least one alignment structure comprising at least one antenna connected to a semiconductor device on the first semiconductor wafer, the at least one antenna in each of the first alignment arrays having the capability of being selectively activated to function as a charge source or as a charge sensing receptor, the alignment arrays being located in kerf areas of the first semiconductor wafer;

(b) programming the at least one alignment structure in each of the first alignment arrays in the first semiconductor wafer with a unique identifier and initially programming the at least one alignment structure to function as a charge source;

(c) obtaining the second semiconductor wafer having a plurality of selectively-activated second alignment arrays for aligning the second semiconductor wafer with the first semiconductor wafer, each of the second alignment arrays comprising a difference engine and at least one alignment structure comprising at least one antenna connected to a semiconductor device on the second semiconductor wafer, the at least one antenna in each of the second alignment arrays having the capability of being selectively activated to function as a charge source or as a charge sensing receptor, the alignment arrays being located in kerf areas of the first semiconductor wafer;

(d) programming the at least one alignment structure in each of the second alignment arrays in the second semiconductor wafer with a unique identifier and initially programming the at least one alignment structure as to function as a charge sensing receptor;

(e) placing the first semiconductor wafer in proximity to the second semiconductor wafer;

(f) processing by the difference engine in the second alignment arrays the charge sensed by each of the charge sensing receptors and determining if the charge sensed by each of the charge sensing receptors is substantially equal;

(g) when the charge sensed at each of the charge sensing receptors is not substantially equal, moving at least one of the first semiconductor wafer and the second semiconductor wafer relative to one another; and (h) repeating (f) and (g) until the charge sensed at each of the charge sensing receptors is substantially equal.

BRIEF DESCRIPTION OF SEVERAL VIEWS OF THE DRAWINGS

The features of the exemplary embodiments believed to be novel and the elements characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

FIGS. 5A to 5C are plan views of the alignment structures shown in FIG. 4 wherein

DETAILED DESCRIPTION

Figure 1:
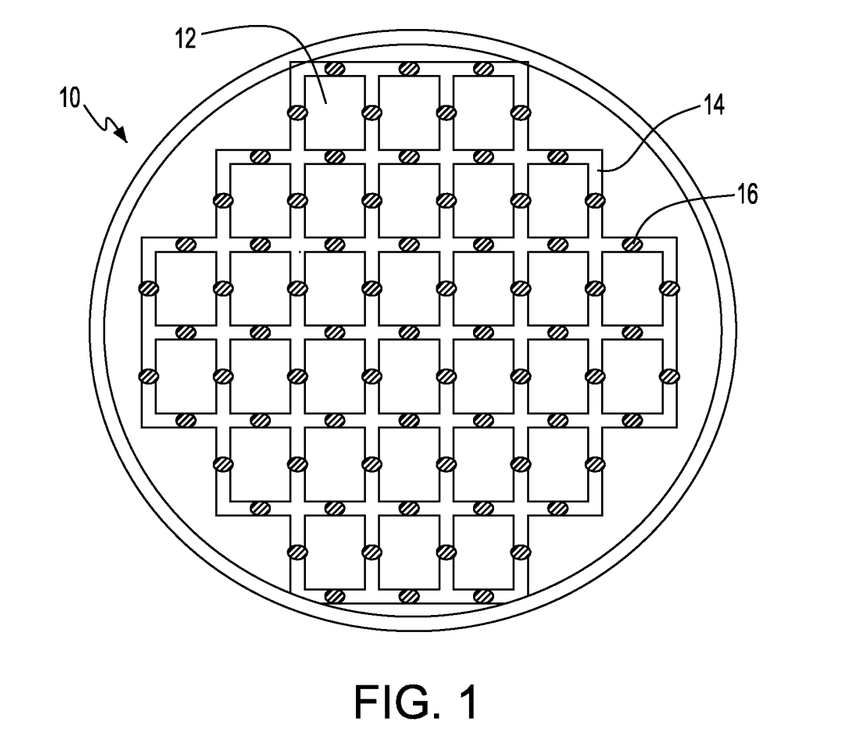
FIG. 1 is a plan view of a grid array of semiconductor chips having alignment arrays in the kerf areas of the semiconductor chips.

Referring to the Figures in more detail, and particularly referring to FIG. 1, there is illustrated a semiconductor wafer 10 having a grid array of semiconductor chips 12, hereafter referred to as chiplets. Between each of the chiplets 12 is a kerf area 14. According to the exemplary embodiments, there are a plurality of alignment arrays 16 (schematically illustrated as oval shapes) inserted in the kerf areas 14. The alignment arrays 16 will be described in more detail hereafter. As will be described in more detail hereafter, the exemplary embodiments may use triangulation in conjunction with the alignment arrays to align adjacent semiconductor wafers.

As shown in FIG. 1, there is an alignment array 16 in the kerf area 14 on each side of each of the chiplets 12. However, there need not be alignment arrays 16 around each and every chiplet 12 but there should be sufficient alignment arrays 16 to achieve alignment of adjacent semiconductor wafers 10. With the teachings of the exemplary embodiments, a person skilled in the art may determine an optimum number of chiplets 12 having the alignment arrays 16.

Figure 2:
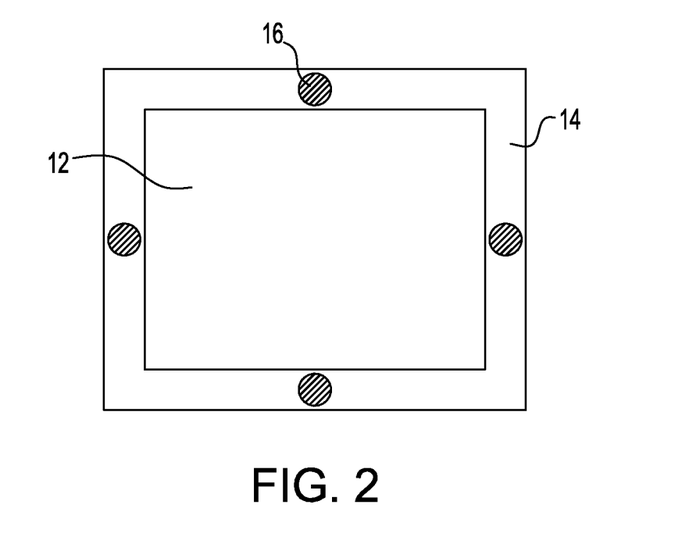
FIG. 2 is an enlarged view of one of the semiconductor chips having alignment arrays in the kerf areas.

While the number of alignment arrays 16 is variable, the alignment arrays 16 when present should be symmetrically placed around the chiplet 12. That is, for a given chiplet 12, there should be an alignment array 16 in each kerf area 14 surrounding the chiplet 12. Further, each alignment array 16 preferably should be placed at the midpoint of each edge of the chiplet 12. During normal test operations, such as wafer final test, test pads not illustrated in the Figures may be used to program a unique identifier for each alignment array 16, for subsequent identification and use to determine where array data originates. Referring now to FIG. 2, there is illustrated an enlargement of one of the chiplets 12 of FIG. 1. It can be seen that the alignment arrays 16 are located within the kerf area 14 and symmetrically placed around the chiplet 12.

It should also be understood that the alignment arrays 16 may be selectively activated so only certain of the alignment arrays 16 may be activated at any one time. Of course, it is within the scope of the exemplary embodiments for all alignment arrays 16 to be activated at the same time if necessary for alignment of adjoining wafers.

Figure 3:
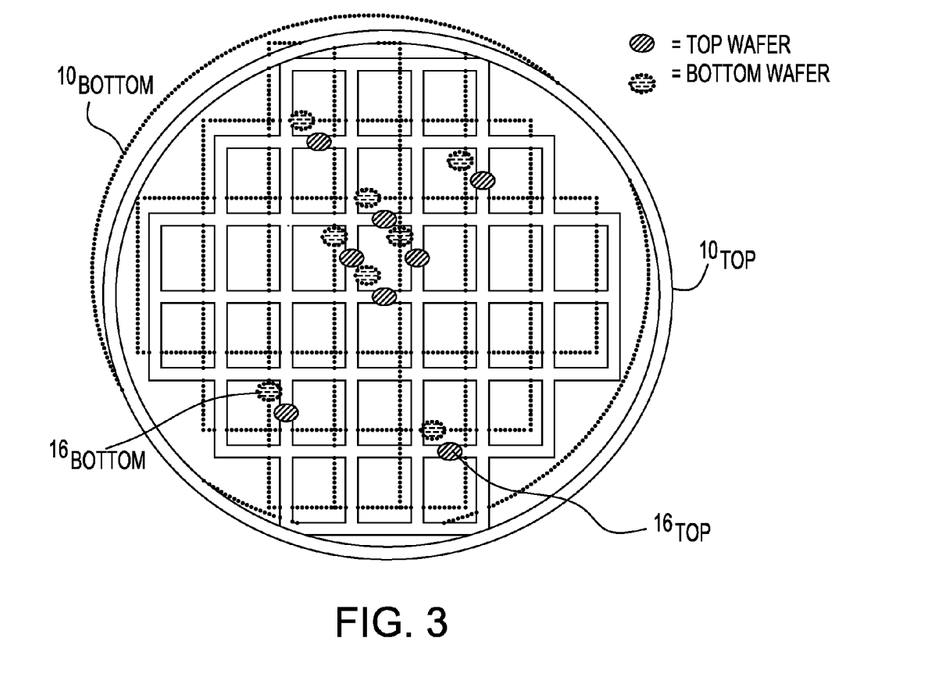
FIG. 3 is a plan view of two semiconductor wafers in misalignment with the alignment arrays on the semiconductor wafers being selectively activated.

Referring now to FIG. 3, semiconductor wafers 10 are to be aligned for further processing. Apparently, the semiconductor wafers 10 are in misalignment. If the semiconductors wafers 10 were perfectly aligned, the kerf areas 14 would be indistinguishable from each other under normal magnifications. The semiconductor wafer on top is denoted as $10_{top}$ while the semiconductor wafer on the bottom is denoted as $10_{bottom}$. Each of the semiconductor wafers 10 have a plurality of alignment arrays 16 with the alignment arrays 16 on the top wafer $10_{top}$ being denoted as $16_{top}$ and the alignment arrays 16 on the bottom wafer $10_{bottom}$ being denoted as $16_{bottom}$. The alignment arrays 16 in both of the semiconductor wafers 10 have been selectively activated such that there is one alignment array $16_{top}$ in the top semiconductor wafer $10_{top}$ near each selectively activated alignment array $16_{bottom}$ in the bottom semiconductor wafer $10_{bottom}$. Again, since only certain of the alignment arrays $16_{top}$, $16_{bottom}$ have been activated, there are other alignment arrays $16_{top}$, $16_{bottom}$ which have not been activated. Shown in FIG. 3 are only those alignment arrays 16 which have been selectively activated.

Figure 4:
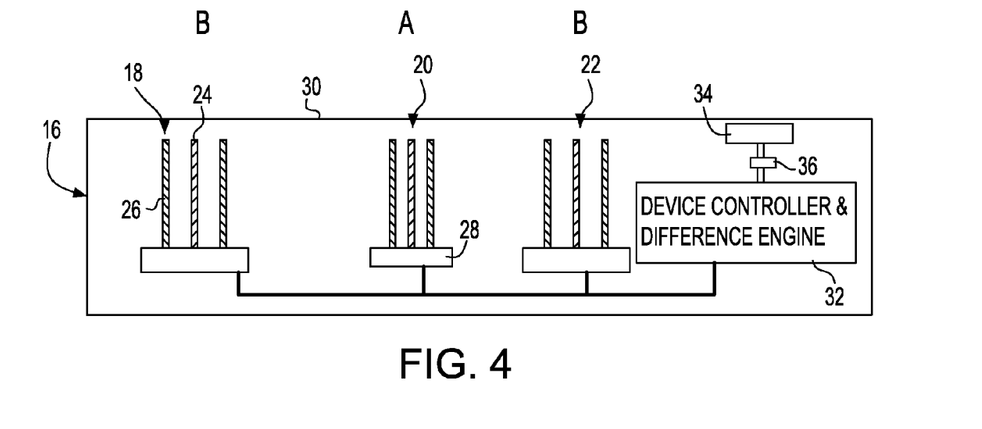
FIG. 4 is a partial cross sectional view of a first embodiment of an alignment array.

Referring now to FIG. 4, there is shown in more detail an alignment array 16. FIG. 4 is a partial cross section through the alignment array 16 of semiconductor wafer 10. The alignment array may have three alignment structures 18, 20, 22. In this exemplary embodiment, each alignment structure includes a centrally located source 24 and three or more receptors 26 surrounding the source 24. The third receptor 26 is not visible in FIG. 4. The source 24 may be a fixed or mobile charge or a variation in charge density that is measured by the receptors 26 on the adjoining semiconductor wafer 10. A fixed charge exists at the end of the source 24 while a mobile charge moves from the source 24 to the receptors 26. The variation in charge density may be a radio wave. Each of the source 24 and receptors 26 are actually antennae that extend from and are connected to a semiconductor device 28. The source 24 may be connected to the semiconductor device drain while the receptors 26 may be connected to the semiconductor device gate. For maximum effectiveness, the source 24 and receptors 26 should be near the surface 30 of the semiconductor wafer 10.

The semiconductor devices 28 for each of the alignment structures 18, 20, 22 are connected to a device controller and difference engine 32. The alignment array 16 may further include an external communication antenna 34, such as a serpentine antenna, to receive power and instructions from a source such as a wafer chuck (not shown). The power may be transmitted to external communication antenna 34 by, for example, induction. The power transmitted to external communication antenna 34 may charge a capacitor 36 which in turn powers the alignment structures 18, 20, 22.

The alignment array 16 may include at least two different alignment structures. Alignment structures 18, 22 have a radial dimension measured from the center of the source 24 to the receptors 26 that is greater than the radial dimension measured from the center of the source 24 to the receptors 26 for alignment structure 20. That is, the receptors 26 are spaced farther from the source 24 in alignment structures 18, 22 than in alignment structure 20. This relationship is clearly shown in FIG. 4. Generally speaking, the spacing between source 24 and receptors 26 may be in the range of 1 to 100 microns. For convenience, alignment structures 20 may be conveniently referred to as "A" alignment structures while alignment structures 18, 22 may be conveniently referred to as "B" alignment structures.

Figure 5A:
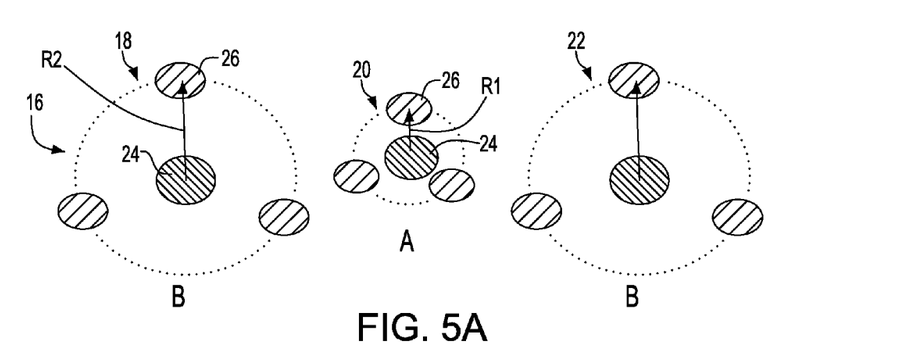
FIG. 5A is a plan view of the alignment structures in one semiconductor wafer.
Figure 5B:
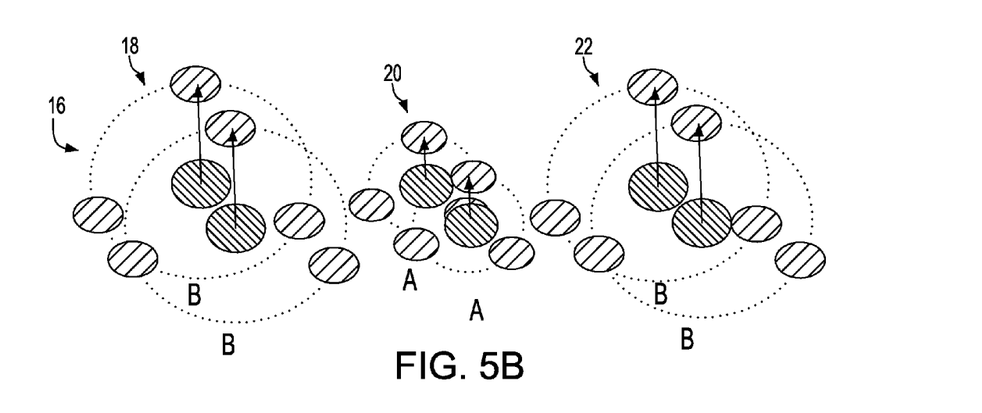
FIG. 5B is a plan view of the alignment structures in adjacent semiconductor wafers in misalignment and FIG. 5C is a plan view of the alignment structures in FIG. 5B after being partially aligned and ready for final alignment.
Figure 5C:
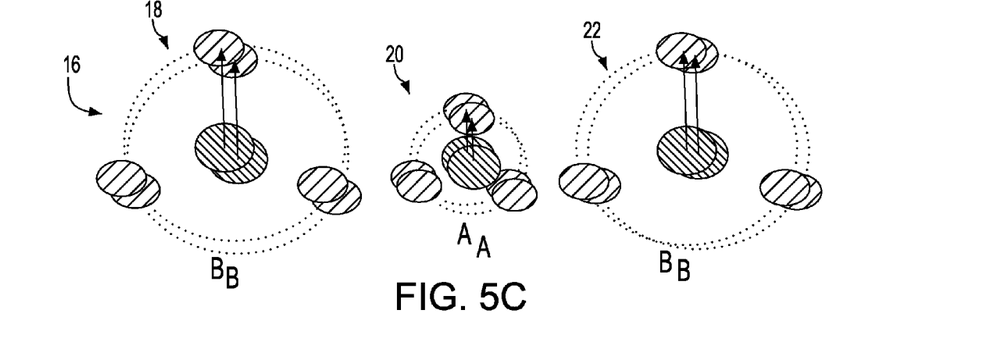

A top view of the alignment array 16 of FIG. 4 is shown in FIG. 5A wherein R2>R1. R2 for the B structures may be about 3 to 30 times that of R1 for the A structures. The larger the radial difference between R1 and R2, the better the ability to detect gross misalignment and correct the misalignment. An upper limit for R2 may be the available space in the kerf area. The dotted circles shown in FIGS. 5A, 5B and 5C are constructions showing that the receptors 26 may be equally spaced from the sources 24 and also equally circumferentially spaced from each other receptor 26. The dotted circles are not actually part of the alignment arrays 16.

In FIG. 5B, the alignment mismatch between adjacent wafers 10 is illustrated in FIG. 5B where it can be seen that the alignment array 16 in one semiconductor wafer (e.g., top semiconductor wafer $10_{top}$) is distinct from the alignment array 16 of another semiconductor wafer 10 (e.g., bottom semiconductor wafer $10_{bottom}$). It is noted that the alignment structures 18, 22, being larger than alignment structure 20, may be used for coarse alignment while alignment structure 20 may be used for fine alignment.

In FIG. 5C, the semiconductor wafers 10 have been brought together so that alignment structure 20 now may be used for fine tuning. After the fine tuning using alignment structure 20, the semiconductor wafers 10 should be in alignment.

Figure 6:
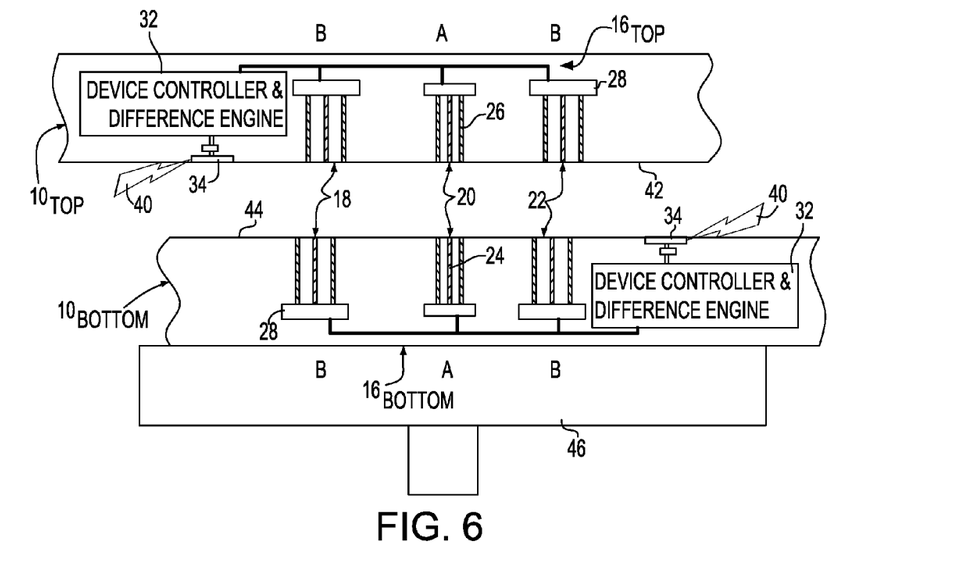
FIG. 6 is a partial cross sectional view of first and second semiconductor wafers being aligned for bonding and having the alignment structures of FIG. 4.

FIG. 6 illustrates the operation of one exemplary embodiment wherein the bottom semiconductor wafer $10_{bottom}$ is placed on a semiconductor wafer chuck 46. The frontside 44 (active side) of the bottom semiconductor wafer $10_{bottom}$ is facing up. Top semiconductor wafer $10_{top}$ is turned upside down so that its frontside 42 (active side) faces the frontside 44 of the bottom semiconductor wafer $10_{bottom}$. Frontside to frontside bonding is preferred for the exemplary embodiments.

Power 40 and instructions may be supplied to the external communication antenna 34 of each of the alignment arrays $16_{top}$, $16_{bottom}$ by induction from semiconductor wafer chuck 80.

Each of the alignment arrays $16_{top}$, $16_{bottom}$ includes alignment structures 18, 20, 22 and device controller/difference engine 32 described previously with respect to FIG. 4. When two semiconductor wafers 10 are placed adjacent to one another, the alignment arrays 16 may be selectively activated as described previously. Further, the sources 24 of the alignment structures on one semiconductor wafer 10 may be activated while the receptors 26 of matching alignment arrays in the other semiconductor wafer 10 may be activated. For example, the alignment array $16_{top}$ may be activated and in approximate alignment (i.e., matches) with activated alignment array $16_{bottom}$ such as shown in FIG. 5B. The sources 24 of alignment array $16_{bottom}$ may be activated while the receptors 26 of alignment array $16_{top}$ may be activated. The reverse could also be true; that is the receptors 26 of alignment array $16_{bottom}$ may be activated while the sources 24 of alignment array $16_{top}$ may be activated. The charge from the sources 24 of each of the alignment structures 18, 20, 22 in alignment array $16_{bottom}$ may be sensed by the receptors 26 of each of the alignment structures 18, 20, 22 in alignment array $16_{top}$ which causes a change in current to the semiconductor devices 28 in alignment array $16_{top}$. This change in current to each semiconductor device 28 in alignment array $16_{top}$ is measured by the difference engine 32 in alignment array $16_{top}$. When this change in current is substantially equal at all receptors 26 in alignment array $16_{top}$, then the semiconductor wafer $10_{top}$ is properly aligned to the semiconductor wafer $10_{bottom}$.

It should be understood that the change in current to all of the receptors 26 in alignment array 16$_{top}$ may not be 100% equal but if the change in current to all of the receptors in alignment array 16$_{top}$ is substantially equal, that is something less than 100% but acceptable within tolerance limits, then the respective semiconductor wafers are considered to be aligned. The tolerance limits may be empirically determined. The objective is to look for the best alignment at the maximum number of alignment arrays between the first and second semiconductor wafers. In one exemplary embodiment, the maximum number of alignment array should be in alignment within ±0.5 um. It may be that only a portion of adjacent semiconductor wafers may be able to be aligned. In this latter case, the exemplary embodiments look to find the maximum number of alignment arrays in this portion of the semiconductor wafers that are aligned, preferably within ±0.5 um.

For purposes of fabricating the alignment arrays 16, the antennae for the sources 24/receptors 26, and interconnect wiring (not shown) may be fabricated in the back end of the line (BEOL) portion of the semiconductor wafer 10 while the semiconductor devices 28 may be fabricated in the front end of the line (FEOL) portion of the semiconductor wafer 10. The active sensor/source structures and the device controller/difference engine may also be fabricated in the FEOL portion of the semiconductor wafer 10. An example of a difference engine may be a differential operational amplifier.

Figure 7:
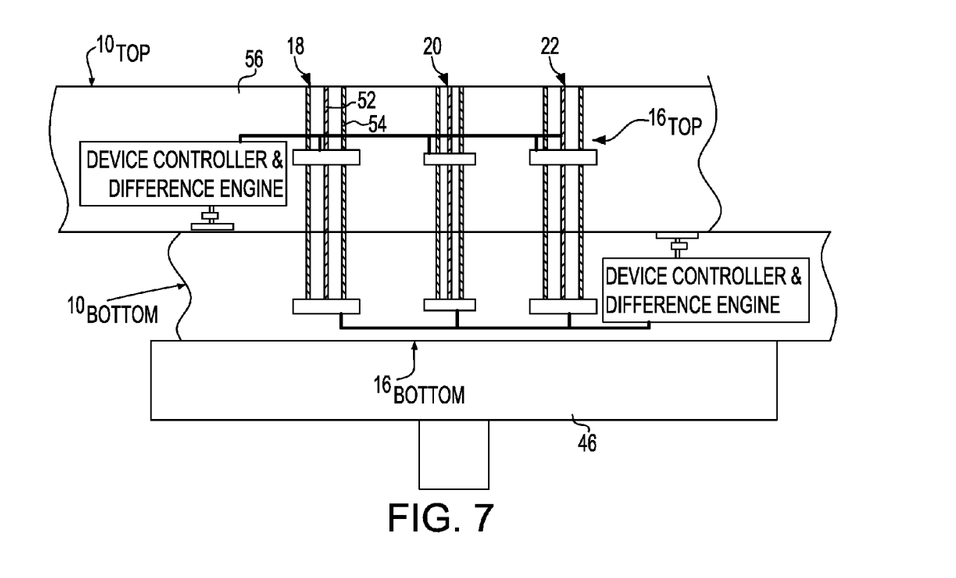
FIG. 7 is a partial cross sectional view of the first and second semiconductor wafers of FIG. 6 being aligned for bonding and having the alignment structures of FIG. 4 and further wherein the top semiconductor wafer has been modified for aligning and bonding with a third semiconductor wafer (not shown).

Often there may be a third (or even more) semiconductor wafer joined to the stack of bottom semiconductor wafer 10$_{bottom}$ and top semiconductor wafer 10$_{top}$. Since it is preferred that the semiconductor wafers be joined frontside to frontside, top semiconductor wafer 10$_{top}$ may need to be modified. As shown in FIG. 7, additional sources 52 and receptors 54 may be added to extend from semiconductor device 28 in alignment array 16$_{top}$. The antennae for the sources 52 and receptors 54 should extend to the backside 56 of semiconductor wafer 10$_{top}$ as shown in FIG. 7. The modified top semiconductor wafer 10top is now suitable for aligning with a third semiconductor wafer (not shown) according to the teachings of the exemplary embodiments.

In the above embodiments where there were three receptors and one source in each alignment structure of each alignment array, the alignment structures may be modified in a further exemplary embodiment so that there is one receptor and three or more sources in each alignment structure. The modification of the alignment structures may be facilitated by embedded logic controllers within the device controller that upon receiving an external (radio) signal for each unique alignment structure, programs the receptor and source antennae to act as either a receptor or charge source.

In another exemplary embodiment, there may be a "C" alignment structure which has a different radial dimension between the source and the receptor than either of the "A" or "B" structures described above. The alignment structures may be arranged so that, for example, $R_C > R_B > R_A$ with respect to their radial dimensions.

Figure 8:
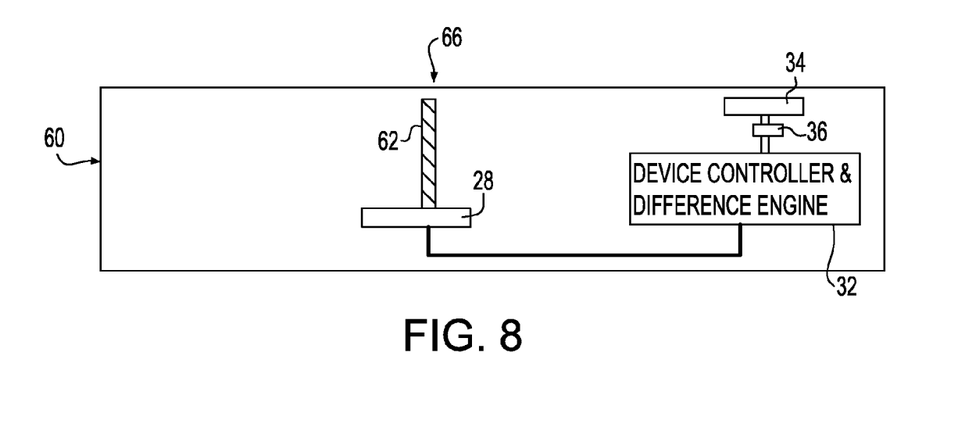
FIG. 8 is a partial cross sectional view of a second embodiment of an alignment array.

A further exemplary embodiment is illustrated in FIG. 8. In this exemplary embodiment, the alignment array 60 includes external communication antenna 34, capacitor 36, and device controller/difference engine 32 as in previous embodiments. In this exemplary embodiment, there may be only one semiconductor device 28 and only one alignment structure 66 having one alignment antenna 62 that may be programmed as either a source or receptor. When multiple alignment arrays 60 may be activated on each of adjacent semiconductor wafers, the alignment antennae programmed as sources on one semiconductor wafer aligning with the alignment antennae programmed as receptors 62 on the adjacent semiconductor wafer should be sufficient to align the semiconductor wafers.

Figure 9:
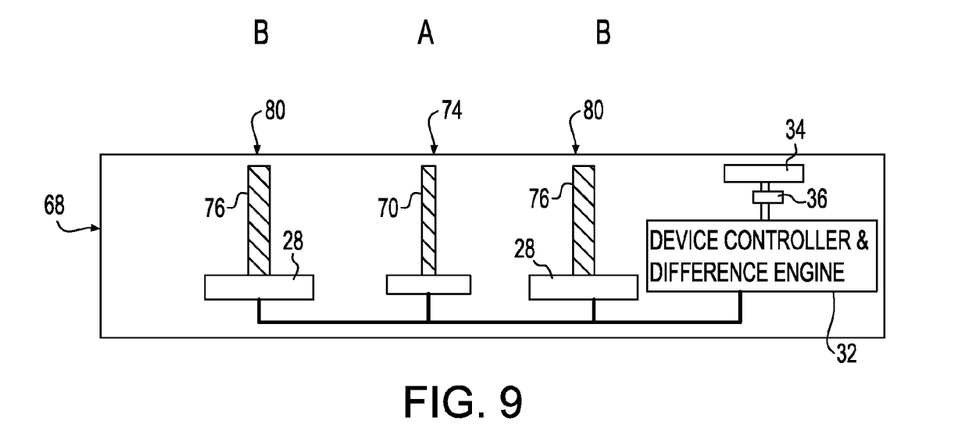
FIG. 9 is a partial cross sectional view of a third embodiment of an alignment array.

Another exemplary embodiment is illustrated in FIG. 9. In this exemplary embodiment, the alignment array 68 includes external communication antenna 34, capacitor 36, and device controller/difference engine 32 as in previous embodiments. In this exemplary embodiment, there may be two or more alignment structures 74, 80, Alignment structure 74 may have only one alignment antenna 70 that may be programmed as either a source or receptor on semiconductor device 28. Alignment structure 80 may have only one alignment antenna 76 that may be programmed as either a source or receptor on another semiconductor device 28. However, the diameter of antenna 76 may be larger than the diameter of antenna 70. The diameter of antenna 76 may be about 3 to 30 times that of antenna 70. The larger the diameter difference between antenna 76 and antenna 70, the better the ability to detect gross misalignment and correct the misalignment. An upper limit for antenna 76 may be the available space in the kerf area.

It should be understood that the foregoing exemplary embodiments may be mixed on the same semiconductor wafer so as to achieve the objective of aligning adjacent semiconductor wafers. For example, the alignment arrays illustrated in FIGS. 6, 8 and 9 may also be present on the same semiconductor wafer.

Figure 10:
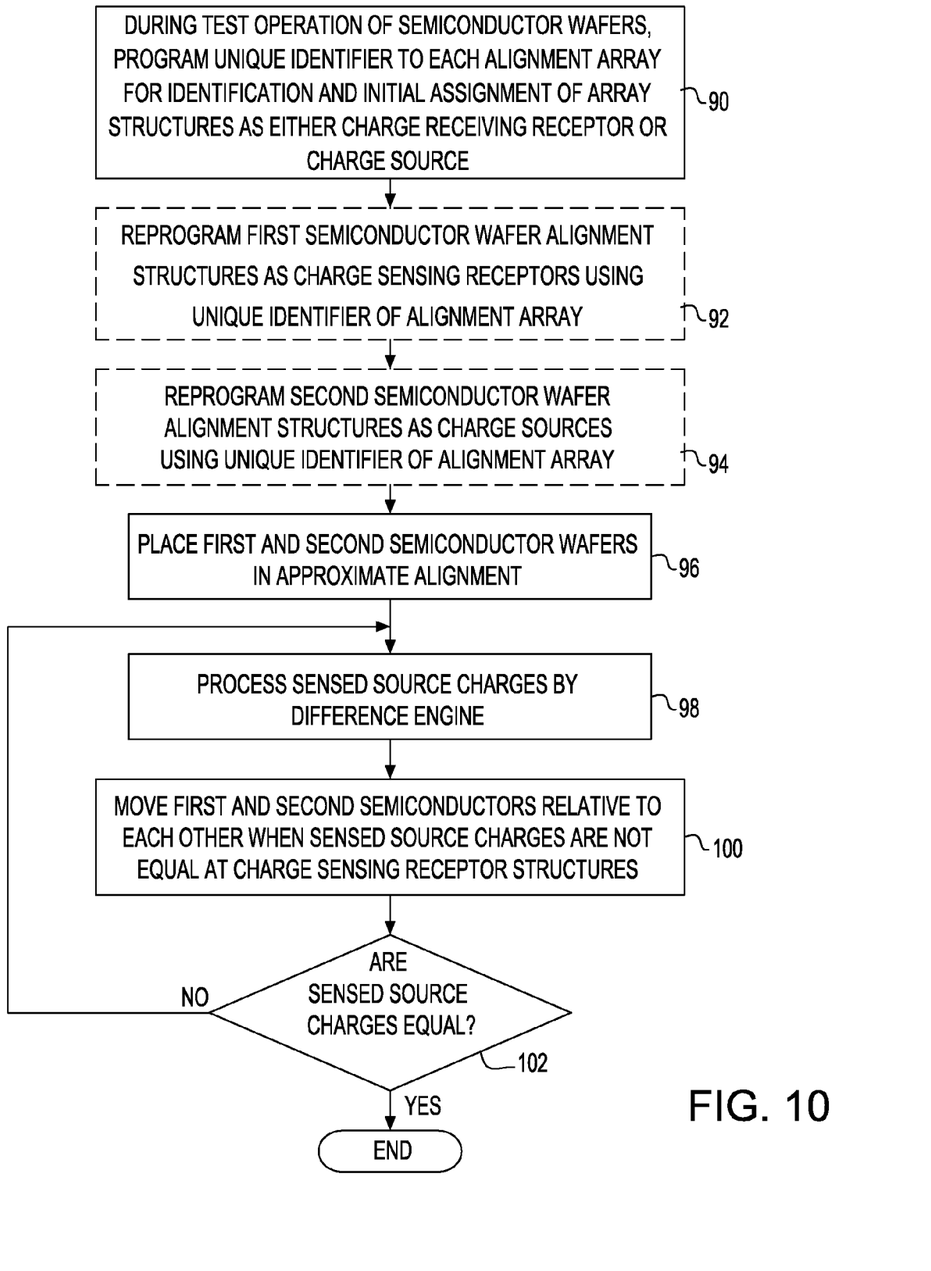
FIG. 10 is a flow chart illustrating a process of aligning semiconductor wafers according to an exemplary embodiment of the present invention.

A further exemplary embodiment is illustrated in FIG. 10 wherein an exemplary process flow for practicing the exemplary embodiments is illustrated. In a first process, the alignment arrays on semiconductor wafers may be programmed during test operation with a unique identifier to each alignment array for identification during subsequent external (radio) communication. Further, using the unique identifier, the alignment structures are initially assigned as either charge receiving receptors or charge sources, box 90. Each antenna within each alignment structure may also be programmed as a charge receiving receptor or charge source. It is important to understand that the alignment structures may function as either charge receiving receptors or charge sources and each antenna within each alignment structure may function as a charge receiving receptor or charge source. The functionality of the alignment structures and antennae are initially assigned during test operation.

In an optional second process, where two semiconductor wafers are to be aligned, the alignment structures on one of the two semiconductor wafers may be reprogrammed as charge sensing receptors using the unique identifier of the alignment array, box 92. Each alignment structure that is reprogrammed as charge sensing receptors may further include an antenna electrically connected to a semiconductor device in which the antenna is also reprogrammed to be a charge sensing receptor. The charge sensing receptors may be arranged in a pattern such as that disclosed in FIGS. 4, 5, 8 and 9.

In an optional third process, where two semiconductor wafers are to be aligned, the alignment structures on the second of the two semiconductor wafers may be reprogrammed as charge sources using the unique identifier of the alignment array, box 94. Each charge source may have a fixed, mobile or variable charge. Each alignment structure that is reprogrammed as a charge source may further include an antenna electrically connected to a semiconductor device in which the antenna is also reprogrammed to be a charge source.

That is, the functionality of the alignment structures in the alignment arrays in the first and second semiconductor wafers may be changed to fit the needs of the alignment process.

The first and second semiconductor wafers are placed in approximate alignment so that each charge source in the second semiconductor wafer is positioned so as to be adjacent to a charge sensing receptor in the first semiconductor wafer, box 96. This is similar to what is illustrated in FIGS. 5A, 5B and 5C.

In a next process, the charge sensing receptor senses the source charge from the source, box 98. The source charge sensed by the charge sensing receptors is processed by a difference engine in the semiconductor wafer having the charge sensing receptors which communicates with the charge sensing receptors, box 98. The difference engine determines the source charge at each of the charge sensing receptors and determines if the source charge at the charge sensing receptors is substantially equal (as defined previously).

When the source charge at each of the charge sensing receptors is not substantially equal, then this data may be transmitted with the unique identifier that is related to the transmitting alignment array location to an external alignment fixture through either direct electrical contact or radio communication for either direct alignment motion or additional calculation prior to corrective alignment motion, such that the first semiconductor wafer and the second semiconductor wafer are moved with respect to each other, box 100.

If the source charges sensed are substantially equal, the semiconductor wafers are aligned and the process ends or if the source charges sensed are not substantially equal, the process proceeds back to sense the source charge by the charge sensing receptors and repeat the following process steps, box 102.

It will be apparent to those skilled in the art having regard to this disclosure that other modifications of the exemplary embodiments beyond those embodiments specifically described here may be made without departing from the spirit of the invention. Accordingly, such modifications are considered within the scope of the invention as limited solely by the appended claims.

What is claimed is:

1. Wafer to wafer alignment comprising:

a first semiconductor wafer having a plurality of semiconductor chips and kerf areas surrounding each of the semiconductor chips and a second semiconductor wafer having a plurality of semiconductor chips and kerf areas surrounding each of the semiconductor chips;

the first semiconductor wafer having a plurality of selectively-activated first alignment arrays for aligning the first semiconductor wafer with the second semiconductor wafer, each of the first alignment arrays comprising a difference engine and at least one alignment structure comprising at least one antenna connected to a semiconductor device on the first semiconductor wafer, the at least one antenna in each of the first alignment arrays being selectively activated to act as a charge source or as a charge sensing receptor, the first alignment arrays being located in the kerf areas of the first semiconductor wafer;

the second semiconductor wafer having a plurality of selectively activated second alignment arrays for aligning the first semiconductor wafer with the second semiconductor wafer, each of the second alignment arrays comprising a difference engine and at least one alignment structure comprising at least one antenna connected to a semiconductor device on the second semiconductor wafer, the at least one antenna in each of the second alignment arrays being selectively activated to act as a charge source or as a charge sensing receptor, the second alignment arrays being located in the kerf areas of the second semiconductor wafer; and wherein in operation the antenna in the at least one alignment structure in each of the first alignment arrays being activated as the charge sensing receptor to form a plurality of charge sensing receptors and the antenna in the at least one alignment structure in the second alignment arrays being activated as the charge source to form a plurality of charge sources, the first semiconductor wafer and the second semiconductor wafer being moved relative to one another until the plurality of source charges sensed by the plurality of charge sensing receptors and processed by the difference engine in each of the first alignment arrays are substantially equal at each of the plurality of charge sensing receptors.

2. The wafer to wafer alignment of claim 1 wherein each of the first alignment arrays comprises a plurality of alignment structures and wherein each of the second alignment arrays comprises a plurality of alignment structures.

3. The wafer to wafer alignment of claim 2 wherein each alignment structure in each of the first alignment arrays comprises a plurality of antennae connected to the semiconductor device with each antenna being selectively activated to act as a charge source or as a charge sensing receptor and wherein each alignment structure in each of the second alignment arrays comprises a plurality of antennae connected to the semiconductor device with each antenna being selectively activated to act as a charge source or as a charge sensing receptor.

4. The wafer to wafer alignment of claim 3 wherein the antennae in each alignment structure in each of the first alignment arrays are arranged in a pattern such that one antenna is surrounded by a plurality of antennae and wherein the antennae in each alignment structure in each of the second alignment arrays are arranged in a pattern such that one antenna is surrounded by a plurality of antennae.

5. The wafer to wafer alignment of claim 4 wherein the one antenna in each alignment structure in each of the first alignment arrays is a charge source and the plurality of surrounding antennae are charge sensing receptors and wherein the one antenna in each alignment structure in each of the second alignment arrays is a charge source and the plurality of surrounding antennae are charge sensing receptors.

6. The wafer to wafer alignment of claim 4 wherein the one antenna in each alignment structure in each of the first alignment arrays is a charge sensing receptor and the plurality of surrounding antennae are charge sources and wherein the one antenna in each alignment structure in each of the second alignment arrays is a charge sensing receptor and the plurality of surrounding antennae are charge sources.

7. The wafer to wafer alignment of claim 2 wherein each alignment structure in each of the first alignment arrays comprising one antenna connected to the semiconductor device with the one antenna being selectively activated to act as a charge source or as a charge sensing receptor and wherein each alignment structure in each of the second alignment arrays comprising one antenna connected to the semiconductor device with the one antenna being selectively activated to act as a charge source or as a charge sensing receptor.

8. The wafer to wafer alignment of claim 4 wherein there is a first alignment array having at least two alignment structures in which the antennae are arranged in a pattern such that in one of the at least two alignment structures the distance between the one antenna and one of the plurality of antennae that surrounded the one antenna is R1 and in a second of the at least two alignment structures the distance between the one antenna and one of the plurality of antennae that surrounded the one antenna is R2 where R1 is at least 3 times larger than RD2.

9. The wafer to wafer alignment of claim 1 wherein there is at least one of the first alignment arrays having only one alignment structure comprising only one antenna connected to the semiconductor device and wherein there is at least one of the second alignment arrays having only one alignment structure comprising only one antenna connected to the semiconductor device.

10. The wafer to wafer alignment of claim 1 wherein there is at least one of the first alignment arrays having two alignment structures in the same alignment array comprising only one antenna connected to the semiconductor device.

11. The wafer to wafer alignment of claim 10 wherein the antenna in a first of the two alignment structures has a first diameter and the antenna in a second of the two alignment structures has a second diameter such that the first diameter is at least three times greater than the second diameter.

12. The wafer to wafer alignment of claim 1 wherein the charge source is a fixed, mobile or variable charge on the at least one antenna of the at least one alignment structure of the first alignment arrays and the second alignment arrays.

13. The wafer to wafer alignment of claim 1 wherein each of the first alignment arrays and the second alignment arrays further comprising an external communication antenna to receive a power signal from a power source and a capacitor for each antenna that is charged by the power signal received by the antenna.

14. The wafer to wafer alignment of claim 3 wherein the antennae in each alignment structure of the first plurality of alignment arrays are spaced apart a distance of 1-100 microns.

15. A semiconductor wafer having alignment structure comprising:
a plurality of semiconductor chips and kerf areas surrounding each of the semiconductor chips;
a plurality of selectively-activated alignment arrays for aligning the semiconductor wafer with another semiconductor wafer, each of the alignment arrays comprising a difference engine and at least one alignment structure comprising at least one antenna connected to a semiconductor device on the semiconductor wafer, the at least one antenna in each of the alignment arrays being selectively activated to act as a charge source or as a charge sensing receptor, the alignment arrays being located in the kerf areas of the first semiconductor wafer; and;
wherein in operation the antenna in the at least one alignment structure in each of the alignment arrays being selectively activated as the charge sensing receptor to form a plurality of charge sensing receptors or being selectively activated as the charge source to form a plurality of charge sources, the selectively activated plurality of charge sensing receptors or the selectively activated plurality of charge sources cooperating with the another semiconductor wafer to align the semiconductor wafer with the another semiconductor wafer.

16. A method of wafer to wafer alignment comprising:
(a) obtaining a first semiconductor wafer having a plurality of selectively-activated first alignment arrays for aligning the first semiconductor wafer with a second semiconductor wafer, each of the first alignment arrays comprising a difference engine and at least one alignment structure comprising at least one antenna connected to a semiconductor device on the first semiconductor wafer, the at least one antenna in each of the first alignment arrays having the capability of being selectively activated to function as a charge source or as a charge sensing receptor, the alignment arrays being located in kerf areas of the first semiconductor wafer;
(b) programming the at least one alignment structure in each of the first alignment arrays in the first semiconductor wafer with a unique identifier and initially programming the at least one alignment structure to function as a charge source;
(c) obtaining the second semiconductor wafer having a plurality of selectively-activated second alignment arrays for aligning the second semiconductor wafer with the first semiconductor wafer, each of the second alignment arrays comprising a difference engine and at least one alignment structure comprising at least one antenna connected to a semiconductor device on the second semiconductor wafer, the at least one antenna in each of the second alignment arrays having the capability of being selectively activated to function as a charge source or as a charge sensing receptor, the alignment arrays being located in kerf areas of the first semiconductor wafer;
(d) programming the at least one alignment structure in each of the second alignment arrays in the second semiconductor wafer with a unique identifier and initially programming the at least one alignment structure as to function as a charge sensing receptor;
(e) placing the first semiconductor wafer in proximity to the second semiconductor wafer;
(f) processing by the difference engine in the second alignment arrays the charge sensed by each of the charge sensing receptors and determining if the charge sensed by each of the charge sensing receptors is substantially equal;
(g) when the charge sensed at each of the charge sensing receptors is not substantially equal, moving at least one of the first semiconductor wafer and the second semiconductor wafer relative to one another; and
(h) repeating (f) and (g) until the charge sensed at each of the charge sensing receptors is substantially equal.

17. The method of claim 16 wherein the charge source is a fixed, mobile or variable charge on the at least one antenna of the at least one alignment structure of the first alignment arrays and the second alignment arrays.

18. The method of claim 16 further comprising reprogramming the at least one alignment structure in each of the first alignment arrays in the first semiconductor wafer using the unique identifier to change the function of the at least one alignment structure in the first semiconductor wafer from the charge source to a charge receiving receptor.

19. The method of claim 18 further comprising reprogramming the at least one alignment structure in each of the second alignment arrays in the second semiconductor wafer using the unique identifier to change the function of the at least one alignment structure in the second semiconductor wafer from the charge receiving receptor to a charge source.

20. The method of claim 16 (i) wherein each of the first alignment arrays comprises a plurality of alignment structures wherein each alignment structure in each of the first alignment arrays comprises a plurality of antennae connected to the semiconductor device with each antenna being selectively activated to act as a charge source or as a charge sensing receptor, and (ii) wherein each of the second alignment arrays comprises a plurality of alignment structures and wherein each alignment structure in each of the second alignment arrays comprises a plurality of antennae connected to the semiconductor device with each antenna being selectively activated to act as a charge source or as a charge sensing receptor.

* * * * *